United States Patent [19]
Mori

[11] Patent Number: 6,005,293
[45] Date of Patent: Dec. 21, 1999

[54] WIRE-BONDED SEMICONDUCTOR DEVICE

[75] Inventor: Nobuyuki Mori, Kumamoto, Japan

[73] Assignee: NEC Corporation, Tokyo, Japan

[21] Appl. No.: 08/903,434

[22] Filed: Jul. 30, 1997

[30] Foreign Application Priority Data

Jul. 30, 1996 [JP] Japan .................................. 8-200658

[51] Int. Cl.$^6$ .................................................. H01L 23/49
[52] U.S. Cl. .......................................... 257/784; 257/786
[58] Field of Search .................................... 257/784, 786

[56] References Cited

U.S. PATENT DOCUMENTS

| | | | |
|---|---|---|---|
| 4,618,879 | 10/1986 | Mizukaihi et al. | 257/784 |
| 5,168,368 | 12/1992 | Gow, 3rd et al. | 257/784 |
| 5,296,744 | 3/1994 | Liang et al. | 257/784 |
| 5,359,227 | 10/1994 | Liang et al. | 257/784 |
| 5,497,031 | 3/1996 | Kozone | 257/784 |
| 5,606,196 | 2/1997 | Lee et al. | 257/784 |
| 5,723,906 | 3/1998 | Rush | 257/784 |
| 5,734,559 | 3/1998 | Banerjee et al. | 257/784 |
| 5,757,082 | 5/1998 | Shibata | 257/784 |

FOREIGN PATENT DOCUMENTS

| | | |
|---|---|---|
| 2-87637 | 3/1990 | Japan . |
| 6-85149 | 3/1994 | Japan . |
| 6-350013 | 12/1994 | Japan . |
| 9-260413 | 10/1997 | Japan . |

*Primary Examiner*—John Guay
*Attorney, Agent, or Firm*—Young & Thompson

[57] ABSTRACT

The present invention provides a wire-bonding structure of a semiconductor device comprising short and long bonding-wires. The short bonding-wires are provided for electrical connections between outer-positioned electrode bonding pads of the semiconductor device and inner-positioned inner lead bonding pads of longer inner leads. The long bonding-wires are provided for electrical connections between inner-positioned electrode bonding pads of the semiconductor device and outer-positioned inner lead bonding pads of shorter inner leads so that the short bonding-wires and the long bonding-wires area alternately aligned. The short bonding-wires rise to a first top level from the outer-positioned electrode bonding pads and slope down gradually from the first top level onto the inner-positioned inner lead bonding pads. The long bonding-wires rise to a second top level higher than the first level from the inner-positioned electrode bonding pads and slope down gradually from the second top level onto the outer-positioned inner lead bonding pads, whereby the long bonding-wires are kept in higher level than and differ in three-dimensional position from the short bonding-wires.

6 Claims, 2 Drawing Sheets

WIRE-BONDED SEMICONDUCTOR DEVICE

BACKGROUND OF THE INVENTION

The present invention relates to a wire-bonded semiconductor device, and more particularly to a wire-bonded semiconductor device with staggeringly aligned wire-bonding pads and a method of wire-bonding a semiconductor device.

A typical one of the conventional wire-bonded semiconductor device will be described with reference to FIGS. 1A and 1B. FIG. 1A is a fragmentary cross sectional elevation view illustrative of a wire-bonded semiconductor device packaged in a sealing resin material. FIG. 1B is a partially enlarged plane view illustrative of a wire-bonded semiconductor device of FIG. 1A. A semiconductor device 23 is placed on an island 28. The semiconductor device 23 is square-shaped and has a peripheral area on which bonding electrode pads 24 are provided to align along each side of the square-shaped semiconductor device 23. Inner leads 21 are provided which extend outwardly in radial directions. Inside end portions of the inner leads 21 are spaced apart from the outside edges of the semiconductor device 23. The positions of the inside edges of the inner leads 21 are different in distance to the outside edge of the semiconductor device 23 between adjacent two inner leads 21 so that the inside edges of the inner leads 21 are staggeringly aligned. Namely, one of the adjacent two inner leads 21 has an inner-positioned inside edge which is thus positioned closer to the peripheral edge of the semiconductor device 1 than outer-positioned inside edge of the remaining one of the adjacent two inner leads 21 so that the inner-positioned inside edges and the outer-positioned inside edges are alternately aligned. Inside bonding pads 21a are provided on the inner-positioned inside edges of the inner leads 21 whilst the outside bonding pads 21b are provided on the outer-positioned inside edges of the inner leads 21. A ridged taping material 22 is provided which extends along between alignments of the inside and outside bonding pads 21a and 21b so that the inside and outside bonding pads 21a and 21b are separated by the ridged taping material 22. The bonding electrode pads 24 of the semiconductor device 1 are bonded via bonding-wires 25 to the inside and outside bonding pads 21a and 21b of the inner leads 21. The wire-bonded semiconductor device 23, the bonding-wires 25 and the island 28 are sealed with a sealing resin material 30.

As illustrated in FIG. 1B, a distance between the adjacent two inner leads 21 is made narrow gradually in the inside direction toward the semiconductor device 23 so that the inner leads 21 become closer to each other as the position is closer to the peripheral edge of the semiconductor device 1. The ridged taping material 22 provided between the alignments of the inside and outside bonding pads 21a and 21b hold the inner-positioned inside edges and prevent the inner-positioned inside edges from dislocation. The inner-positioned inside edges of the inner leads 21 is thus made free of dislocation. This means that the provision of the ridged taping material 22 prevents contacts between the inner-positioned inside edges of the inner leads 21. This means that the provision of the ridged taping material 22 allows the inner-positioned inside edges of the inner leads 21 to be made closer to the peripheral edge of the semiconductor device 23. This firer means that the provision of the ridged taping material 22 prevents contacts between the inner-positioned inside edges of the inner leads 21, even the pitch of the inner-positioned inside edges of the inner leads 21 is extremely narrow. If the inner-positioned inside edges of the inner leads 21 have the closer positions to the peripheral edge of the semiconductor device 1, this means that the bonding-wires 25 are short so that the bonding-wires 25 have no remarkable bending or dangling. The longer bonding-wires 25 connecting the bonding electrode pads 24 to the outside bonding pads 21b of the inner leads 21 is arched to cross over the ridged taping material 22 whereby remarkable bending or dangling of the longer bonding-wires 25 are prevented. This contributes to prevent contacts between the inner-positioned inside edges of the inner leads 21 or between the longer bonding-wire 25 and adjacent inner-positioned inside potion of the inner lead 21.

The above-described conventional wire-bonded semiconductor device, however, has disadvantages as follows. At the comer of the semiconductor device 23, the adjacent longer and shorter bonding wires are likely to be contacted to form a short circuit because the outside and inside bonding pads 21a and 21b are concentrated in the vicinity of the corner of the semiconductor device 1 and because the distances between the adjacent bonding electrode pads 24 and between the adjacent bonding-wires 25 are narrower in the vicinity of the comer of the semiconductor device 1.

Another disadvantage of the above-described conventional wire-bonded semiconductor device is in a possibility of displacement of the arched center portion of the bonding-wires 25, particularly the longer bonding-wires 25 caused by pressures of molten sealing resin material 30, when the semiconductor device 23 is packaged with the sealing resin material 30.

In place of the wire-bonded semiconductor device, a tape-automated bonding structure has been known. Notwithstanding, the tape-automated bonding structure may raise another disadvantage in higher manufacturing cost than the wire-bonded semiconductor device.

In the above circumstances, it had been required to develop a novel wire-bonding structure of a wire-bonded semiconductor device free from the above disadvantages.

SUMMARY OF THE INVENTION

Accordingly, it is an object of the present invention to provide a novel wire-bonding structure of a semiconductor device free from the above disadvantages.

The above and other objects, features and advantages of the present invention will be apparent from the following descriptions.

The present invention provides a wire-bonding structure of a semiconductor device comprising short and long bonding-wires. The short bonding-wires are provided for electrical connections between outer-positioned electrode bonding pads of the semiconductor device and inner-positioned inner lead bonding pads of longer inner leads. The long bonding-wires are provided for electrical connections between inner-positioned electrode bonding pads of the semiconductor device and outer-positioned inner lead bonding pads of shorter inner leads so that the short bonding-wires and the long bonding-wires are alternately aligned. The short bonding-wires so vary in level as to rise to a first top level from the outer-positioned electrode bonding pads and slope down gradually from the first top level onto the inner-positioned inner lead bonding pads. The long bonding-wires so vary in level as to rise to a second top level higher than the first level from the inner-positioned electrode bonding pads and slope down gradually from the second top level onto the outer-positioned inner lead bonding pads, whereby the long bonding-wires are kept in higher level than and differ in three-dimensional position from the short bonding-wires entirely.

The present invention provides a method of wire-bonding a semiconductor device. Short bonding-wires are provided for electrical connections between outer-positioned electrode bonding pads of the semiconductor device and inner-positioned inner lead bonding pads of longer inner leads, wherein the short bonding-wires so vary in level as to extend to rise up to a first top level from the outer-positioned electrode bonding pads and further extend to slope down gradually from the first top level onto the inner-positioned inner lead bonding pads. Thereafter, long bonding-wires are provided for electrical connections between inner-positioned electrode bonding pads of the semiconductor device and outer-positioned inner lead bonding pads of shorter inner leads so that the short bonding-wires and the long bonding-wires are alternately aligned, wherein the long bonding-wires so vary in level as to extend to rise up to a second top level higher than the first level from the inner-positioned electrode bonding pads and further extend to slope down gradually from the second top level onto the outer-positioned inner lead bonding pads, whereby the long bonding-wires are kept in higher level than and differ in three-dimensional position from the short bonding-wires entirely.

BRIEF DESCRIPTION OF THE DRAWINGS

Preferred embodiments according to the present invention will be described in detail with reference to the accompanying drawings.

DISCLOSURE OF THE INVENTION

Figure 1A:
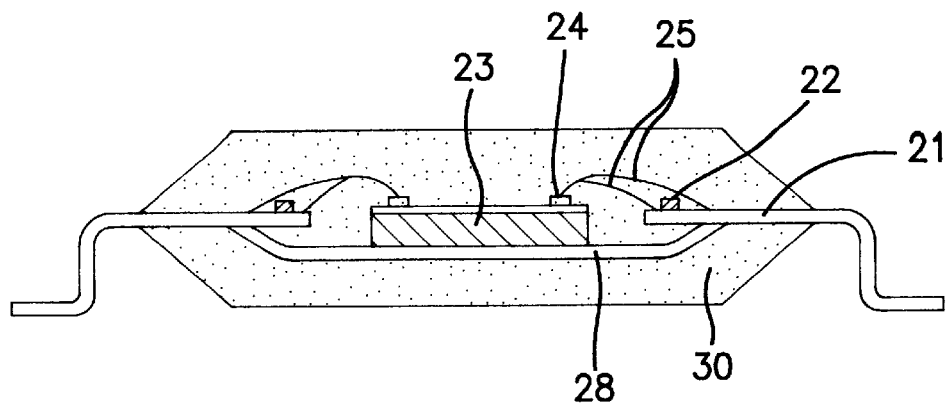
FIG. 1A is a fragmentary cross sectional elevation view illustrative of the conventional wire-bonded semiconductor device packaged in a sealing resin material.
Figure 1B:
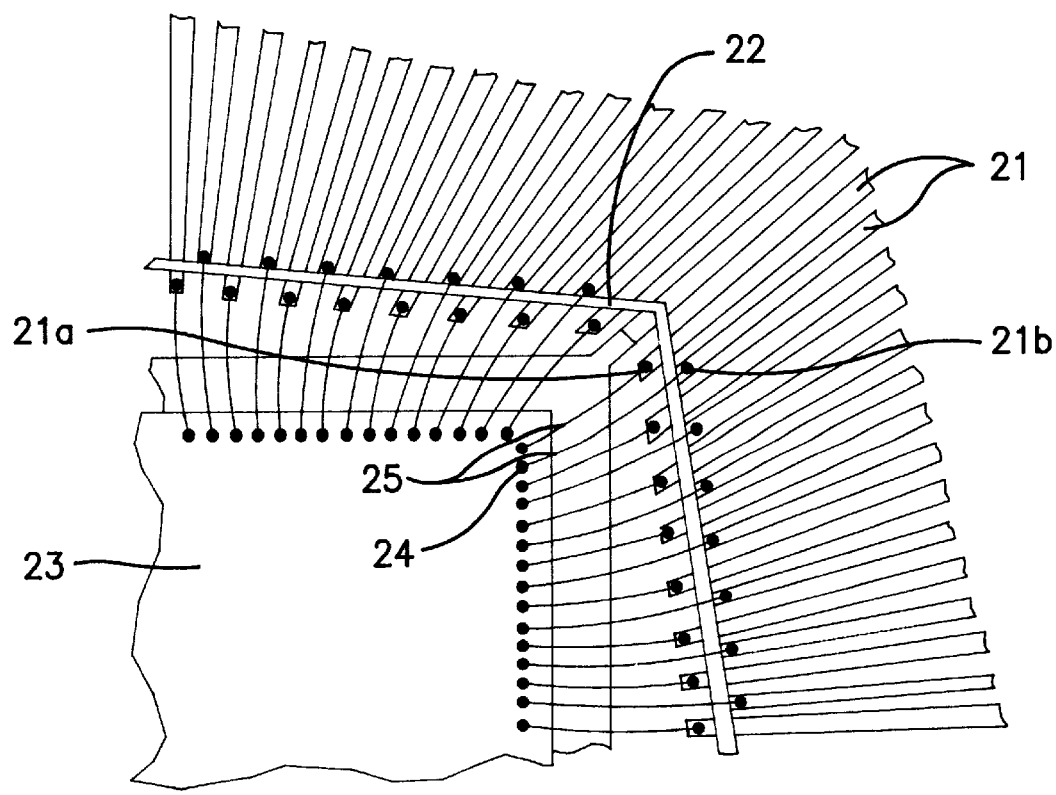
FIG. 1B is a partially enlarged plane view illustrative of the conventional wire-bonded semiconductor device of FIG. 1A.

The present invention provides a wire-bonding structure of a semiconductor device comprising short and long bonding-wires. The short bonding-wires are provided for electrical connections between outer-positioned electrode bonding pads of the semiconductor device and inner-positioned inner lead bonding pads of longer inner leads. The long bonding-wires are provided for electrical connections between inner-positioned electrode bonding pads of the semiconductor device and outer-positioned inner lead bonding pads of shorter inner leads so that the short bonding-wires and the long bonding-wires are alternately aligned. The short bonding-wires so vary in level as to rise to a first top level from the outer-positioned electrode bonding pads and slope down gradually from the first top level onto the inner-positioned inner lead bonding pads. The long bonding-wires so vary in level as to extend to rise up to a second top level higher than the first level from the inner-positioned electrode bonding pads and slope down gradually from the second top level onto the outer-positioned inner lead bonding pads, whereby the long bonding-wires are kept in higher level than and differ in three-dimensional position from the short bonding-wires entirely.

It is preferable that the short bonding-wires and the long bonding-wires are made of gold.

The present invention also provides a wire-bonded semiconductor device. A semiconductor device is placed on an island. Outer-positioned electrode bonding pads and inner-positioned electrode bonding pads are aligned alternately on a peripheral portion of the semiconductor device so that the outer-positioned electrode bonding pads and the inner-positioned electrode bonding pads are staggeringly aligned so as to form both inner and outer alignments parallel to each other. Shorter inner leads and longer inner leads are alternately aligned which extend outwardly in radial directions. The shorter inner leads have outer-positioned inside end portions which are spaced apart by a large distance from a peripheral edge of the semiconductor device whilst the longer inner leads have inner-positioned inside end portions which are also spaced apart by a small distance from the peripheral edge of the semiconductor device and closer to the peripheral edge of the semiconductor device than the outer-positioned inside end portions. Outer-positioned inner lead bonding pads are provided on the outer-positioned inside end portions of the shorter inner leads. Inner-positioned inner lead bonding pads are provided on the inner-positioned inside end portions of tie longer inner leads so that the outer-positioned inner lead bonding pads and the inner-positioned inner lead bonding pads are alternately and staggeringly aligned. A ridged taping material is provided which extends over the shorter inner leads and the longer inner leads and also extends along between the outer-positioned inner lead bonding pads and the inner-positioned inner lead bonding pads. Short bonding-wires are provided for electrical connections between the outer-positioned electrode bonding pads of the semiconductor device and the inner-positioned inner lead bonding pads of the longer inner leads. Long bonding-wires are provided for electrical connections between the inner-positioned electrode bonding pads of the semiconductor device and the outer-positioned inner lead bonding pads of the shorter inner leads so that the short bonding-wires and the long bonding-wires are alternately aligned. The short bonding-wires so vary in level as to extend to rise up to a first top level from the outer-positioned electrode bonding pads and further extend to slope down gradually from the first top level onto the inner-positioned inner lead bonding pads. The long bonding-wires so vary in level as to extend to rise to a second top level higher than the first level from the inner-positioned electrode bonding pads and further extend to slope down gradually from the second top level onto the outer-positioned inner lead bonding pads, whereby the long bonding-wires are kept in higher level than and differ in three-dimensional position from the short bonding-wires entirely.

It is preferable that the short bonding-wires and the long bonding-wires are made of gold.

In the novel wire-bonding structure of the semiconductor device, the long bonding-wires are kept in higher level than and differ in three-dimensional position from the short bonding-wires entirely. This means that even if in the plane view the adjacent short and long bonding-wires are close to each other for satisfy the requirement of high density packaging of the semiconductor device, then the adjacent short and long bonding-wires are three-dimensionally spaced apart from each other by sufficient distances for certainly preventing any contact between the adjacent short and long bonding-wires and any formation of short circuit between them.

The above-described novel wire-bonded semiconductor device, thus, has advantages as follows. At the corner of the semiconductor device, the adjacent longer and shorter bonding wires are hard to be contacted to form a short circuit because the adjacent short and long bonding-wires are three-dimensionally spaced apart form each other by sufficient distances even in the plane view the adjacent short and long bonding-wires are close to each other for satisfy the requirement of high density packaging of the semiconductor device.

Another advantage of the above-described novel wire-bonded semiconductor device is in almost no possibility of formation of any short circuit between the adjacent short and long bonding-wires even if a small displacement of the long bonding-wire appears due to the fact that molten sealing resin material pushes the long bonding-wire toward the short bonding-wire when the semiconductor device is packaged with the sealing resin material, because the adjacent short and long bonding-wires are three-dimensionally spaced apart form each other by sufficient distances even in the plane view the adjacent short and long bonding-wires are close to each other for satisfy the requirement of high density packaging of the semiconductor device.

The present invention provides a method of wire-bonding a semiconductor device. Short bonding-wires are provided for electrical connections between outer-positioned electrode bonding pads of the semiconductor device and inner-positioned inner lead bonding pads of longer inner leads, wherein the short bonding-wires so vary in level as to extend to rise up to a first top level from the outer-positioned electrode bonding pads and further extend to slope down gradually from the first top level onto the inner-positioned inner lead bonding pads. Thereafter, long bonding-wires are provided for electrical connections between inner-positioned electrode bonding pads of the semiconductor device and outer-positioned inner lead bonding pads of shorter inner leads so that the short bonding-wires and the long bonding-wires are alternately aligned, wherein the long bonding-wires so vary in level as to extend to rise to a second top level higher than the first level from the inner-positioned electrode bonding pads and further extend to slope down gradually from the second top level onto the outer-positioned inner lead bonding pads, whereby the long bonding-wires are kept in higher level than and differ in three-dimensional position from the short bonding-wires entirely whereby tbe adjacent short and long bonding-wires are three-dimensionally spaced apart form each other by sufficient distances for certainly preventing any contact between the adjacent short and long bonding-wires and any formation of short circuit between them.

PREFERRED EMBODIMENT

Figure 2A:
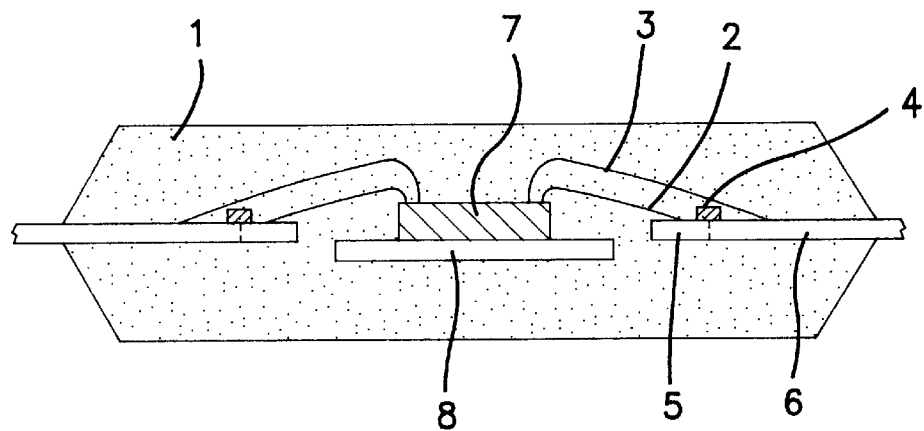
FIG. 2A is a fragmentary cross sectional elevation view illustrative of a novel wire-bonded semiconductor device packaged in a sealing resin material.
Figure 2B:
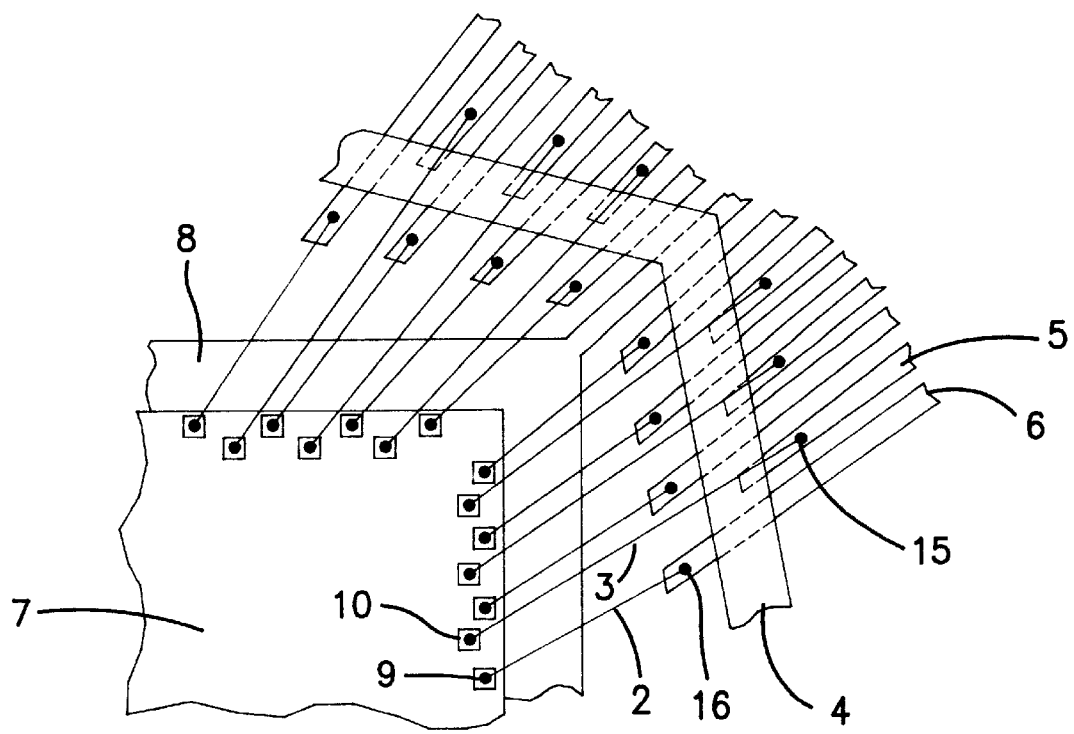
FIG. 2B is a partially enlarged plane view illustrative of a novel wire-bonded semiconductor device of FIG. 2A.

A first embodiment according to the present invention will be described with reference to FIGS. 2A and 2B. FIG. 2A is a fragmentary cross sectional elevation view illustrative of a novel wire-bonded semiconductor device packaged in a sealing resin material. FIG. 2B is a partially enlarged plane view illustrative of a novel wire-bonded semiconductor device of FIG. 2A. A semiconductor device 7 is placed on an island 8. The semiconductor device 7 is square-shaped and has a peripheral area on which outer-positioned electrode bonding pads 9 and inner-positioned electrode bonding pads 10 are aligned alternately along each side of the square-shaped semiconductor device 7. The outer-positioned electrode bonding pads 9 and the inner-positioned electrode bonding pads 10 are staggeringly aligned so as to form both inner and outer alignments parallel to each other wherein the outer alignment comprises the outer-positioned electrode bonding pads 9 whilst the inner alignment comprises the inner-positioned electrode bonding pads 10. Shorter inner leads 5 and longer inner leads 6 are alternately aligned which extend outwardly in radial directions. The shorter inner leads 5 have outer-positioned inside end portions which are spaced apart by a larger distance from the peripheral edge of the semiconductor device 7. The longer inner leads 6 have inner-positioned inside end portions which are also spaced apart by a smaller distance from the peripheral edge of the semiconductor device 7 but closer to the peripheral edge of the semiconductor device 7 than the outer-positioned inside end portions of the shorter inner leads 5. A difference in position between the inner-positioned inside end portions of the longer inner leads 6 and the outer-positioned inside end portions of the shorter inner leads 5 is larger than that of the above described conventional wire-bonding structure. The outer-positioned inside end portions of the shorter inner leads 5 differ from the inner-positioned inside end portions of the longer inner leads 6 in distance to the peripheral edge of the semiconductor device 7. Outer-positioned inner lead bonding pads 15 are provided on the outer-positioned inside end portions of the shorter inner leads 5 whilst inner-positioned inner lead bonding pads 16 are provided on the inner-positioned inside end portions of the longer inner leads 6. Namely, the outer-positioned inner lead bonding pads 15 and the inner-positioned inner lead bonding pads 16 are alternately and staggeringly aligned. A ridged taping material stripe 4 is provided which extends over the shorter inner lead 5 and the longer inner lead 6 and also extends along between the outer-positioned inner lead bonding pads 15 and the inner-positioned inner lead bonding pads 16 so that the outer-positioned inner lead bonding pads 15 are separated by the ridged taping material stripe 4 from the inner-positioned inner lead bonding pads 16. Short bonding-wires 2 are provided for electrical connections between the outer-positioned electrode bonding pads 9 of the semiconductor device 7 and the inner-positioned inner lead bonding pads 16 of the longer inner lead 6. Long bonding-wires 3 are provided for electrical connections between the inner-positioned electrode bonding pads 10 of the semiconductor device 7 and the outer-positioned inner lead bonding pads 15 of the shorter inner lead 5. The short bonding-wires 2 and the long bonding-wires 3 are alternately aligned. As illustrated in FIG. 2A, the short bonding-wires 2 so vary in level as to extend to rise to a first top level from the outer-positioned electrode bonding pads 9 and further extend to slope down gradually from the first top level onto the inner-positioned inner lead bonding pads 16 of the longer inner lead 6. The long bonding-wires 3 so vary in level as to extend to rise to a second top level higher than the first level from the inner-positioned electrode bonding pads 10 and extend to slope down gradually from the second top level across over the ridged taping material stripe 4 onto the outer-positioned inner lead bonding pads 15 of the shorter inner lead 5. The long bonding-wires 3 are kept in higher level than and differ in three-dimensional position from the short bonding-wires 2 entirely. The semiconductor device 7, the short bonding-wires 2, the long bonding-wires 3, the shorter inner lead 5 and the longer inner leads 6 are sealed with a sealing resin material 1.

As described above, in the novel wire-bonding structure of the semiconductor device, the long bonding-wires 3 are kept in higher level than and differ in three-dimensional position from the short bonding-wires 2 entirely. This means that even if in the plane view the adjacent short and long bonding-wires 2 and 3 are close to each other for satisfy the requirement of high density packaging of the semiconductor device, then the adjacent short and long bonding-wires 2 and 3 are three-dimensionally spaced apart form each other by sufficient distances for certainly preventing any contact between the adjacent short and long bonding-wires 2 and 3 and any formation of short circuit between them.

The above-described novel wire-bonded semiconductor device, thus, has advantages as follows. At the corner of the semiconductor device 7, the adjacent longer and shorter bonding wires 2 and 3 are hard to be contacted to form a short circuit because the adjacent short and long bonding-wires 2 and 3 are three-dimensionally spaced apart form each other by sufficient distances even in the plane view the adjacent short and long bonding-wires 2 and 3 are close to each other for satisfy the requirement of high density packaging of the semiconductor device.

Another advantage of the above-described novel wire-bonded semiconductor device is in almost no possibility of formation of any short circuit between the adjacent short and long bonding-wires 2 and 3 even if a small displacement of the long bonding-wire 3 appears due to the fact that molten sealing resin material I pushes the long bonding-wire 3 toward the short bonding-wire 2 when the semiconductor device 7 is packaged with the sealing resin material 1, because the adjacent short and long bonding-wires 2 and 3 are three-dimensionally spaced apart form each other by sufficient distances even in the plane view the adjacent short and long bonding-wires 2 and 3 are close to each other for satisfy the requirement of high density packaging of the semiconductor device.

The above described novel wire-bonded semiconductor device may be fabricated as follows. The semiconductor device 7 is mounted on the island 8. The outer-positioned electrode bonding pads 9 of the semiconductor device 7 are connected via the short bonding-wires 2 made of gold to the inner-positioned inner lead bonding pads 16 of the longer inner lead 6 before the inner-positioned electrode bonding pads 10 of the semiconductor device 7 are connected via the long bonding-wires 3 to the outer-positioned inner lead bonding pads 15 of the shorter inner lead 5 so that the long bonding-wires 3 are kept in higher level than and differ in three-dimensional position from the short bonding-wires 2 entirely whereby the adjacent short and long bonding-wires 2 and 3 are three-dimensionally spaced apart form- each other by sufficient distances for certainly preventing any contact between the adjacent short and long bonding-wires 2 and 3 and any formation of short circuit between them.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A wire-bonding structure of a semiconductor device comprising:

short bonding-wires provided for electrical connections between outer-positioned electrode bonding pads of said semiconductor device and inner-positioned inner lead bonding pads of longer inner leads; and long bonding-wires provided for electrical connections between inner-positioned electrode bonding pads of said semiconductor device and outer-positioned inner lead bonding pads of shorter inner leads so that said short bonding-wires and said long bonding-wires are alternately aligned, wherein said short bonding-wires rise substantially vertically to a first top level from said outer-positioned electrode bonding pads and slope down from said first top level onto said inner-positioned inner lead bonding pads, wherein said long bonding-wires rise substantially vertically to a second top level higher than said first level from said inner-positioned electrode bonding pads and slope down from said second top level onto said outer-positioned inner lead bonding pads, whereby said long bonding-wires are positioned above and differ in three-dimensional position from said short bonding-wires, and wherein a level of said inner-positioned and outer-positioned inner lead bonding pads is intermediate a topmost and a bottommost level of said semiconductor device.

2. The wire-bonding structure as claimed in claim 1, wherein said short bonding-wires and said long bonding-wires are made of gold.

3. A wire-bonded semiconductor device comprising:

a semiconductor device placed on an island;

outer-positioned electrode bonding pads and inner-positioned electrode bonding pads being aligned alternately on a peripheral portion of said semiconductor device so that said outer-positioned electrode bonding pads and said inner-positioned electrode bonding pads are staggeringly aligned so as to form both inner and outer alignments parallel to each other;

shorter inner leads and longer inner leads being alternately aligned which extend outwardly in radial directions, and said shorter inner leads having outer-positioned inside end portions which are spaced apart by a large distance from a peripheral edge of said semiconductor device while said longer inner leads having inner-positioned inside end portions which are also spaced apart by a small distance from said peripheral edge of said semiconductor device and closer to said peripheral edge of said semiconductor device than said outer-positioned inside end portions;

outer-positioned inner lead bonding pads being provided on said outer-positioned inside end portions of said shorter inner leads;

inner-positioned inner lead bonding pads being provided on said inner-positioned inside end portions of said longer inner leads so that said outer-positioned inner lead bonding pads and said inner-positioned inner lead bonding pads are alternately and staggeringly aligned;

a ridged taping material being provided which extends over said shorter inner leads and said longer inner leads and also extends along between said outer-positioned inner lead bonding pads and said inner-positioned inner lead bonding pads;

short bonding-wires being provided for electrical connections between said outer-positioned electrode bonding pads of said semiconductor device and said inner-positioned inner lead bonding pads of said longer inner leads; and long bonding-wires being provided for electrical connections between said inner-positioned electrode bonding pads of said semiconductor device and said outer-positioned inner lead bonding pads of said shorter inner leads so that said short bonding-wires and said long bonding-wires are alternately aligned, wherein said short bonding-wires rise substantially vertically to a first top level from said outer-positioned electrode bonding pads and slope down from said first top level onto said inner-positioned inner lead bonding pads, wherein said long bonding-wires rise substantial vertically to a second top level higher than said first level from said inner-positioned electrode bonding pads and slope down from said second top level onto said outer-positioned inner lead bonding pads, whereby said long bonding-wires are positioned above and differ in three-dimensional position from said short bonding-wires, and wherein a level of said inner-positioned and outer-positioned inner lead bonding pads is intermediate a topmost and a bottommost level of said semiconductor device.

4. The wire-bonding structure as claimed in claim 3, wherein said short bonding-wires and said long bonding-wires are made of gold.

5. The wire-bonding structure of claim 1, wherein the level of said inner-positioned and outer-positioned inner lead bonding pads is approximately midway between said topmost and said bottommost level of said semiconductor device.

6. The wire-bonding structure of claim 3, wherein the level of said inner-positioned and outer-positioned inner lead bonding pads is approximately midway between said topmost and said bottommost level of said semiconductor device.

* * * * *